May 6, 1969 C. F. PULVARI 3,443,170

OHMIC CONTACT TO A SUBSTRATE OF INSULATING MATERIAL HAVING A DOPED SEMICONDUCTIVE OXIDE PROVIDING A STEPPED ENERGY GAP

Original Filed Jan. 27, 1966

INVENTOR

Charles F. Pulvari

BY Nickolas A. Vonneumann

ATTORNEY 3,443,170

OHMIC CONTACT TO A SUBSTRATE OF INSULATING MATERIAL HAVING A DOPED SEMICONDUCTIVE OXIDE PROVIDING A STEPPED ENERGY GAP

Charles F. Pulvari, 2014 Taylor St. NE., Washington, D.C. 20018

Continuation of application Ser. No. 523,431, Jan. 27, 1966. This application Feb. 9, 1968, Ser. No. 705,263
Int. Cl. H01l 3/00, 5/00
U.S. Cl. 317—234 6 Claims

ABSTRACT OF THE DISCLOSURE

An ohmic contact for transferring electrical energy into a substrate of insulating material selected from the class consisting of metal oxide dielectrics, piezoelectric ceramics, piezoelectric crystals, ferroelectric ceramics, ferroelectric crystals, ferrielectric ceramics and ferrielectric crystals is obtained by a thin layer of semiconductor oxide doped with metal impurities, such as a doped tin oxide, in direct contact with the substrate and a metal layer overlying and in direct contact with the semiconductor oxide. The ohmic contact results from selecting the semiconductor oxide layer so that the top of the energy gap of the semiconductor oxide is between the conduction band level of the substrate and the Fermi level of the metal layer and the conduction bands of the semiconductive oxide and of the substrate overlapping.

This application is a continuation of Ser. No. 523,431, filed Jan. 27, 1966, now abandoned.

With the most recently discovered materials exhibiting ferroelectric properties such as ferrielectrics and the new high Curie temperature piezoelectric materials, the hysteresis properties of these ferroelectric crystals, as well as the transducer properties of piezoelectric single crystals or polycrystalline materials, suddenly increased the fields of application practical for these materials in various circuits and devices such as, for example, memory, logic circuits, and calculating devices, as well as new transducer devices including filters and oscillators. In both cases, that is, in switching the hysteresis property and in vibrating piezoelectric transducers, the perfection of operation of either a ferroelectric or piezoelectric element depends on the perfection with which the electrical energy is transferred to the piezoelectric or ferroelectric body through the electrode contacts, because this influences very sensitively the rapidity and regularity with which small electrically polarized units or domains shift within the crystalline structure when an electrical field is applied.

If conducting electrodes need to be mounted on a dielectric material such as piezoelectric transducers (quartz oscillators, $BaTiO_3$, lead zirconate, or $BiTiO_{12}$ elements) or ferroelectric or ferrielectric elements, which may function as rectifiers, thermistors, varistors, capacitors, transpolarizes, filters, oscillators, field effect transistors, or combinations thereof, the difficulty arises that, if electrodes of the common, previously employed metal types are used, the metal dielectric compatability is not satisfactory. Some metals having low work functions—indium deposits, for example—have been used to prepare ohmic contacts, but even in this case the metal dielectric interface provides a number of problems, such as:

(a) The existence of surface electronic energy states at the metal dielectric interface, possibly due to the incompatability of the metal-dielectric energy band structure and/or the surface absorption of gases, notably oxygen.

(b) The insufficient adherence of the metallic layer on the dielectric layer, which was usually improved by the use of some additions of adhesives (such as glassy materials) to the metal.

(c) The buildup of a metal dielectric interface layer which caused in many applications a type of degradation or fatigue effect and drastically reduced the efficient uses of such an element.

(d) Distortions in the hysteresis pattern causing undesired losses and objectionably long transient response times.

(e) An increase of the coercive field as compared to measurements made with liquid electrodes.

These shortcomings have been well recognized and this was the reason that Bell Telephone scientists developed an acid electrode described in U.S. Patents No. 2,785,322 and No. 2,811,655 by Elizabeth A. Wood and Upton B. Thomas, which practically eliminated all these distortions by providing a more direct and intimate contact between the electrode and dielectric or crystal surface so much so that when acid electrodes were used on ferroelectrics or piezoelectric transducers, the fatigue and degradation effects could not be observed.

Research has clearly revealed that the nature of the contact between the conducting electrode and the dielectric to a large extent controls the essential property which fits such elements for the function selected. In general, the problem of developing a conducting electrode contact with a dielectric body which eliminates undesirable metal dielectric interfaces and which has a chemical bond-like adherence to the dielectric such that it withstands rough handling and eliminates the degradation and fatigue effects resulting in an excess loss has plagued researchers and industry equally and prohibited the widespread use of such elements in some practical areas. It became evident, however, that liquid electrodes cause a number of new problems such as a gradual etching of the dielectric or crystal surfaces to which they were applied, and also the formation of some undesirable layers. In general, it was recognized that the quality of the liquid electrodes had been superior to any other previously known electrode. It was also recognized that in practical devices a solid state electrode with an equal or better performance than its liquid counterpart would be a more desirable structure. It is inconceivable that an industry such as the computer industry would employ liquid electrods in devices wherein million or even billions of units must perform stably over long periods of time.

Considering the facts discussed, it is the object of this invention to provide an electrical circuit element comprising conducting electrodes on dielectrics, such as piezoelectric, ferroelectric or ferrielectric dielectrics, in which the metal electrode is not directly deposited or adapted on said dielectrics, but in which the dielectric is first coated with an extremely thin properly doped semiconductor oxide layer which is in contact with a conducting electrode and lead connections. As electrical measurements show, this novel electroding process eliminates the shortcomings of the electrical characteristics enumerated and described. It was furthermore found that this new solid state semiconductive oxide electrode is, in a number of aspects, superior to the liquid electrode previously cited. The most striking advantage of this novel electrode over the liquid electrode is the fact that the thin doped semiconductive metal oxide layer formed on the surface of the dielectric body strongly conducts and is in a truly strong chemical bond with the dielectric body, which is also a metal oxide. Since, however, the whole process of depositing this highly conductive semiconductive oxide layer takes place at a temperature as high as 500°–700° centigrade, the impurities also diffuse to a certain degree into the dielectric body and cause a thin, diffused, conductive skin layer. Besides the fact that such a doped semiconductor dielectric interface is practically free of the undesirable interface phenomena previously discussed, these diffused conducting crystal skins reduce the thickness of that part of the crystal which contributes to the coercive voltage and the result of this reduction is, in effect, tantamount to a decrease in coercive voltage. As an example, in utilizing the hysteresis properties of a crystal it was found that, with the novel, doped, semiconductor electrodes, the coercive voltage of a capacitor so prepared exhibited only about one-half the coercive voltage of an identical capacitor made with the usual deposited silver electrodes. This lowering of the apparent coercive voltage permitted for the first time to attain, for example, $Bi_4Ti_3O_{12}$ crystal elements with a switching voltage as low as 3 volts. The significance and importance of the low switching voltage is best visualized when one considers the fact that if a new solid state component is to be practical, it must be compatible with transistor circuitries, and considering the present state of the art, this requires primarily low operating voltage. This achievement would have been impossible with the usual silver electrodes of any kind.

The doped semiconductive oxide electrode may be deposited by either the pyrolytic decomposition method or by the vapor phase hydrolysis method. In the former case, doped metal hydroxide, for example, may be decomposed, which yields the corresponding oxide by thermal dehydration; or an organometallic compound such as the transition metalcarbonil could be used which yields the corresponding oxide by thermal decarbonylation. As an illustration of the latter method, hydrolysis of doped tin chloride or silicon tetrachloride is mentioned. Since the doped semiconductive metal oxide electrode is formed at relatively high temperatures (approximately 600–700° C.), the chemiabsorbed gases, such as oxygen, are removed. As a result, the formation of a space charge layer on the metal dielectric interface, due to surface electronic energy states, is eliminated. The overall beneficial effect of this process is that the dielectric surface to be coated does not require an acidic cleaning before the deposition of this novel electrode takes place. As a result, the detrimental surface damages due to etch pits, as well as the chemiabsorption of gases, are practically eliminated. The intimate bond and contact of this novel electrode also provides a practically perfect match between the metal contact and the dielectric body, because at the metal-doped semiconductive oxide interface the requirement for an ohmic contact can be met easily. In this case, first the top of the energy gap of the semiconductive oxide must be positioned between the vacuum and Fermi levels of the metal electrode; second, it should be close to the Fermi levels of the metal so that $\phi_1$ can be made small enough (<0.1 ev.) that the contact is ohmic even for an electrode at room temperature, as shown in the simplified energy band representation in FIGURE 1. Here $\psi\hat{m}$ is the work function of the metal; $W_f$ is the Fermi level of the metal; $W_{so}$ represents the energy gap of the doped semiconductive oxide; $\phi_1$ is the potential barrier between the metal on the doped semiconductive oxide; and CB and VB are the conduction band and valence band respectively of the doped semiconductive oxide. Upon inspection of the doped semiconductive oxide-insulator interface, it can readily be seen that the conduction bands of the two materials overlap, and as a result a perfect ohmic contact is secured. It is clearly evident that this invention makes it possible to match the electron injection from a metal to a dielectric by sandwiching between the two a doped semiconductive oxide layer, and for this reason, this type of electrode will be referred to briefly as a matched or graded electrode.

Again, another advantage of this graded electrode is that the mechanical clamping of the crystal surface by the metal electrode is eliminated. This is the result of the fact that the metal electrode is not in direct contact with the crystalline surface, but is, rather, in contact with it through a thin, highly conductive, doped metal oxide layer (1–30 ohm-cm.), which, in fact, consists also of a metal oxide. Consequently the match between the two oxide layers is practically perfect.

Another outstanding advantage of this graded electrode is that the metal-doped semiconductive oxide interface does not require an extremely low work function metal, since $\phi$, the potential barrier, becomes sufficiently low with a number of metals. Therefore a metal which has a strong adherence to the metal oxide layer, such as chromium, nichrome, etc., can be chosen. This permits the use of welded or thermally bonded lead connections, which again contributes in large measure to the eliminating of the clamping of the crystal surface.

A further inherent advantage of this novel electrode structure is that, within each electrode, it permits the building of a small potential barrier, which acts like a threshold, as described in my former U.S. Patent No. 3,126,509. This can be understood by those skilled in the art if, by the proper choosing of the metal electrode and the doped semiconductive oxide interface, $\phi_1$, the potential barrier, is properly set (see FIGURE 1).

Last, but not least, it is noted that since this MSO (metal semiconductive oxide) electrode is prepared at temperatures as high as 700° C., or even more, its range of operation is quite high and represents a dramatic improvement over the liquid electrode. If one considers in addition the fact that very recent developments in transducer technology point toward the trend of high temperature operation, it becomes apparent that a liquid electrode would simply not work. For example, $LiNbO_3$ has a Curie temperature $T_c$ higher than 1000° C., and the $T_c$ of $Bi_4Ti_3O_{12}$ is 673° C. These materials require high temperature electrodes.

This novel MSO electrode can be prepared in various electrode configurations on the surface of a dielectric or semiconductive body similar to those used in microcircuitries or integrated circuitries. Furthermore, since the semiconductive doped metal oxide electrode can be made transparent, it is possible to use it in connection with photoelectric, photoconductive and other radiation detecting devices in which a transparent matched electrode of the type described is desired. In general, this novel MSO electrode is useful whenever a matched electrode is required and a direct ohmic contact between the electrode and the high energy gap semiconductive or insulating material is not possible. It was found, further, that by the proper addition of impurities, in brief, dopants, the charge transfer through the electrode can be controlled and therefore this MSO electrode can also be used as a current limiter. This feature is particularly useful if a high speed ferro- or ferrielectric device is to be prepared and the current transients are to be kept on a low level.

The details of the present invention will become more apparent from the following detailed description taken in conjunction with the attached drawings, in which.

Figure 1:
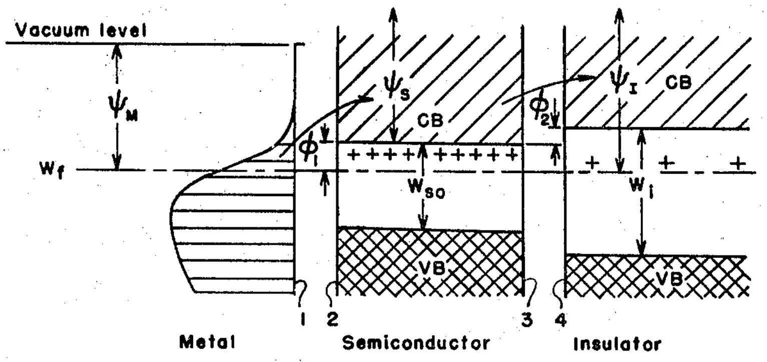
FIGURE 1 is a simplified energy band representation of the metal-doped semiconductive metal oxide-dielectric (MSO) electrode.

Referring now more specifically to FIGURE 1, it is to be noted that, at present, the graded electrode described is not completely understood in all detail; however, an attempt is made to illustrate the effect of a thin, doped semiconductor layer sandwiched between the metal electrode contact and the insulator. Because of the various combinations which are possible using p- and n-type semiconductors, as well as p- and n-type insulators, and various work function materials, for the sake of simplicity we will assume in this illustration a metal, an n-type doped semiconductor and a slightly n-type insulator having in sequence increasing work functions $\psi_m$, $\psi_s$, and $\psi_i$. The three layers in this illustration are presented as they would be just before making contacts. However, the Fermi levels $W_f$ of the MSO layers are shown in an equalized lined up state, or as if the three layers had already been brought into contact. Because at present the type of surface states to be considered are not known, in this simplified discussion the bends of the energy bands at the interfaces called Schottky barriers are not shown. The potential barrier $\phi_1$ between the metal and the doped semiconductive oxide depends on the chemical binding of the electrons in the metal lattice, the number of electrons therein, the surface conditions at the boundary of the metal and the semiconductor, and the chemical binding of the electrons in the semiconductor. The potential barrier $\phi_2$ between the insulator and the semiconductor also depends on such parameters.

For the sake of this discussion let us assume that an ohmic contact is desired. If $\psi_s > \psi_m$ electrons spill over into the conduction band of the semiconductor and make the surface of the semiconductor more n-type. This gives rise to a local field between the interfaces 1 and 2 and causes the lower edge of the conduction band to bend down toward, and even below, the Fermi level of the metal. The reverse is true for a p-type semiconductor when its work function is smaller than that of the metal. The overall result of this is that $\phi_1$, the potential barrier between the metal and doped semiconductive oxide, will be sufficiently low so that a negligible barrier, or none at all, exists for the flow of electrons in either direction for n-type material or for holes in either direction for p-type specimens, and this contact can thus be regarded as an ohmic contact. A similar situation arises between the semiconductor and insulator interfaces 3 and 4 where the lower edges of the conductions bands bend toward each other, but again the potential barrier between the two interfaces 3 and 4 $\phi_2$ can become sufficiently low so that the semiconductor and insulator contact is ohmic, even at room temperature. Without going into further detail, it becomes apparent that if one compared this case with that of a simple metal insulator interface, in the latter instance the overall potential barrier $(\phi_1+\phi_2)$ would be much larger than the subdivided potential barriers $\phi_1$ and $\phi_2$ individually. As a result, an ohmic contact can be provided between a much larger variety of metals and insulators than when a metal is directly evaporated onto the insulator. Various such graded electrodes have been prepared. In some cases indium-doped tin oxide semiconductor layers (p-type) were used for grading between the metal and the insulator, and in other cases antimony-doped tin oxide layers were used, in which latter case this doped semiconductor layer was n-type. We prepared such semiconductor layers on bismuth titanate and barium titanate crystals and ceramics, and in all cases the advantages which have been discussed in the Introduction of this disclosure became apparent and it was possible to observe an even better quality polarization reversal than was experienced with acid electrodes.

To illustrate this invention and demonstrate its characteristics, that form of electrical circuit elements was selected which had the capacitance characteristics to provide a compact high value capacitor having a dielectric of piezoelectric, ferroelectric or ferrielectric behavior and provides a low leakage and good power factor. Such a capacitor in its simplest form consists of a dielectric plate which could be a single crystal plate of, for example, bismuth titanate or quartz, of any thickness, or of any polycrystalline type of material such as barium titanate or lead zirconate. Such a single crystal or polycrystalline plate provides the mechanical support for electrode areas to be deposited and cooperates with such areas to provide the required electrical characteristics.

Figure 2:
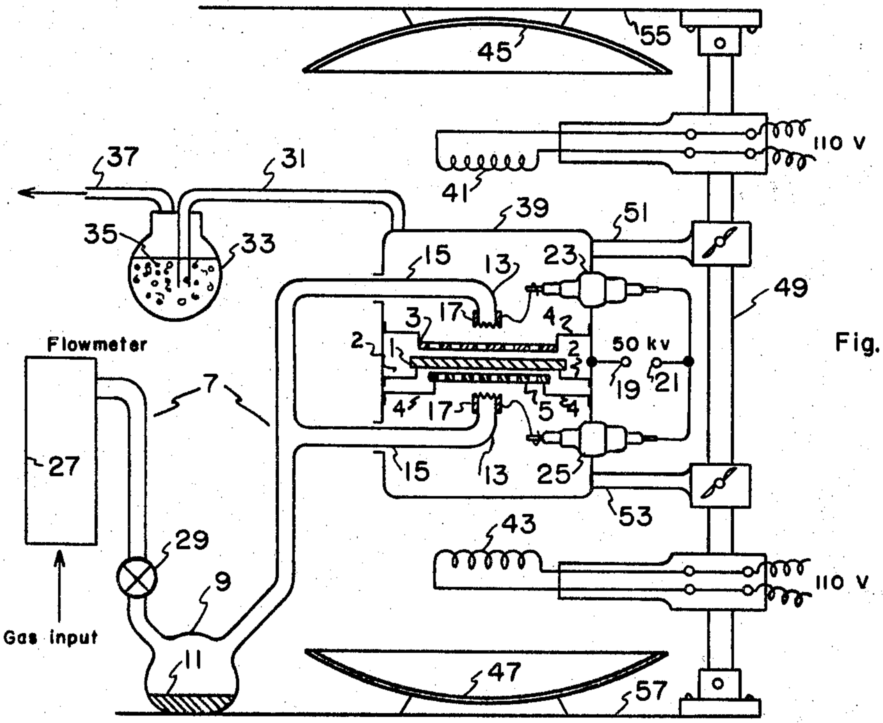
FIGURE 2 is an elevation of an apparatus for depositing semiconductive doped oxide coatings on a dielectric body in accordance with the invention.

Referring now to FIGURE 2, an apparatus is shown which was built to deposit semiconductive doped oxide coatings on a dielectric body. The dielectric body 1 to be coated with doped metal oxide is shown as being sandwiched between a pair of masks 3 and 5. The supports 2 and 4 hold in place the dielectric body 1 and the masks 3 and 5 are fixed to the furnace 39. Although any conventional furnace or hot plate could be used for this process, the furnace 39 is heated in this example by the heater coils 41 and 43 whose heat is radiated in the furnace by the parabolic mirrors 45 and 47. The purpose of this arrangement is to secure sufficient free space for the atomizers and high voltage connections for accelerating the vapors toward the dielectric body. This was found to be useful, but not indispensable, in producing homogeneous deposits. Furnace 39 is held in place by the brackets 51 and 53 which are adjustable on the stand 49. Stand 59 holds through brackets 55 and 57 the reflecting mirrors. The heating coils 41 and 43 connect to a voltage source shown as being 110 volts. It is noted, however, that this voltage can be varied so as to produce the appropriate heat of about 600–700° C. The exact heat required would depend on the type of metal oxide to be deposited. A special type of atomizer 7 was developed which can be made of stainless steel, quartz or glass, or the combination of these, which connects to a container 9 in which the solution of salts 11 to be atomized is placed. The atomizing nozzles 13 connect to tubes 15 through which the metal chlorides pass in front of the masks. On the end of tube 15 a fine needle-like metallic member 17 made out of platinum is fixed to the end of the tube and connects through high voltage feedthrough 23 and 25 which in turn are connected to a high voltage source through connectors 19 and 21 to form a high ionizing field between this needle-like electrode 17 and substrate 1. The high voltage source may be in the voltage range of 30–50 v. The atomizer nozzle 13 is so supported that it is in about a distance of two to five inches above the dielectric body 1 to be coated.

By means of the heating elements the substrate 1 to be coated is heated to a temperature above 500° C., preferable 650° C., and the solution of salts 11 in flask 9 is atomized as a fine mist on the heated substrate plate 1 by passing air in the flowmeter 27 and open to a desired degree the valve 29 for about ten to twenty seconds. The composition of metal chlorides 11 in flask 9, such as $SnCl_4$, are in a form of so called fuming chloride to which to which a very small amount (such as 0.1 to 5.5 mole percent of $SbCl_3$ or $InCl_3$ is added for doping purposes. The metal chlorides are entrained in a jet of air from flask 9 into the furnace. Since no precautions were taken to dry the air used, it contains a residual amount of water vapor. Therefore it is considered that hydrolysis of the metal chlorides occur to yield the corresponding hydroxide plus unhydrolized metal chloride. In the furnace on the surface of the hot substrate 1 the hydroxide undergoes a thermal dehydration to yield the corresponding oxide, in this case stannic oxide ($SnO_2$) in form of a very thin strongly adherent doped metal oxide film. Since for some applications the fine mist of metal chlorides do not possess sufficient velocity, it may not deposit according to proper geometry defined by the mask or masks. For this reason a high potential is applied between the nozzle 13 on which a number of sharpened metal members 17 are apt to product a high field strength around their sharp edges and ionize the fine mist leaving the nozzle. As a consequence, the fine mist is hurled against the heated surface of the substrate 1 and forms the semiconductive metal oxide layer on the desired areas.

For preparing n-type conducting coatings, the tin oxide layers are preferably doped with antimony. If a p-type conducting layer is desired, the tin oxide is doped with indium or cadmium. Other metal oxides such as oxides of the fifth, sixth, third, second or first column of the periodic table could also be used in small amounts not exceeding say about 20%. These impurities are also added, preferably in form of chlorides, which then reduce to their corresponding metal oxides along with the host semiconductor metal oxide which is in this case tin oxide. It was also found advantageous to dissolve the impurity chlorides in a solvent such as chloroform or other alcohol which then is added as an impurity to the fuming tin chloride. The fumes leaving the furnace 39 through the conduit 31 bubbled through an absorbing liquid 35 which is in flask 33 and the excess pressure still existing leaves through the conduit 37.

Figure 3:
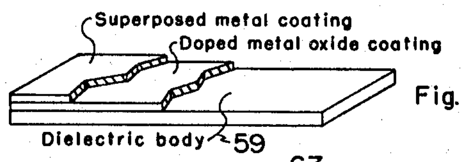
FIGURE 3 is a schematic representation of the graded (MSO) electrode deposited on a dielectric body.

The graded MSO electrode on a dielectric body is shown in FIGURE 3, which is a perspective representation of a dielectric body 59. According to my invention described in the foregoing, the layer thickness of the doped semiconductive metal oxide coating deposited on the dielectric body and the superimposed metal coating to which lead connectors (not shown) can be affixed is greatly exaggerated.

Figure 4:
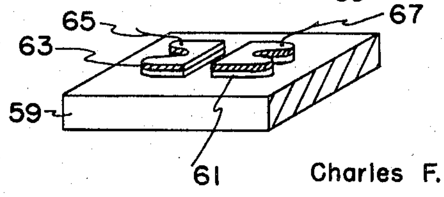
FIGURE 4 is a perspective view of a condenser according to one embodiment of the present invention.

FIGURE 4 shows an arbitrary electrode configuration of this novel graded type on a semiconductive or insulating body 59. These electrodes can be produced by using a mask during the deposition process or by removing the undesired electrode areas by mechanical or chemical means from the areas on which electrodes are not desired. The doped metal oxide portions of the electrode contact are denoted by 61 and 63, while the superimposed metal coatings 65 and 67 serve for affixing lead connectors not shown in the figure.

Figure 5:
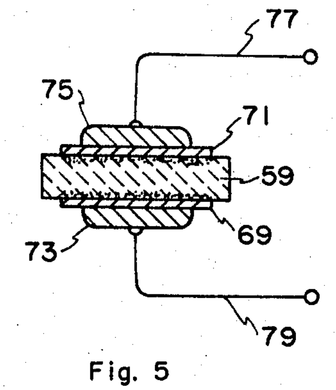
FIGURE 5 is a sectional view of a condenser according to another embodiment of the present invention.

Referring now to FIGURE 5, in order to show the structure of one form of a condenser in accordance with the teaching of the present invention, dielectric layer 59 is shown as being sandwiched between a pair of electrodes of the doped semiconductive metal oxide type 69 and 71. The dots shown near the surface of the dielectric body indicate the intimate contact of this novel electrode deposited at high temperatures with the dielectric body. Dielectric 59 may be a material having electric dipoles therein which may be aligned, the alignment of which may be remanently changed. An example of such a dielectric material is a ferro- or ferrielectric material. A homogeneous ferro- or ferrielectric dielectric composed of single crystals having a collinear or noncollinear dipole structure provides highly nonlinear (substantially rectangular) hysteresis loops when the condenser is operated. However, while such a ferroelectric or ferrielectric may be used, it is important to note that the teaching of the present invention permits the practical use of other ferroelectric dielectrics having an inherent polycrystalline structure, or even some semiconductive properties, which are usually associated with dielectrics comprising some impurities.

The condenser electrodes 69 and 71 are made of a doped semiconductive metal oxide which provides the beneficial properties already described in detail. A preferred material for the electrodes 69 and 71 is a doped tin oxide layer. The assembly of the dielectric 59 and semiconductive metal oxide electrodes 69 and 71 is in turn sandwiched between a pair of metal layers 73 and 75. The metal layers 73 and 75 may be superimposed on the doped metal oxide electrode contacts 69 and 71 by, for example, evaporation. The metal layers 73 and 75, in conjunction with the metal oxide electrodes 69 and 71, provide either an ohmic contact, which is the desired effect in most cases, or a potential barrier at each side of the dielectric body. Said barrier may have the electrical characteristics of a diode if the metal and doped metal oxide coating is so chosen. In other words, the junction between metal 71 and electrode 75, and also the junction between metal 73 and electrode 69 may, in this case, possess the electrical property of having a high back impedance and a low forward impedance. This case may be utilized if a threshold switching field is required. Condenser leads 77 and 79 are suitably connected to the conductive layers 73 and 75 as shown in FIGURE 5. Through condenser leads or terminals 77 and 79 the device can be operated or connected into a circuit.

In summary, I obtain substantially improved switching and operating characteristics by using, instead of liquid electrodes, a chemically bonded deposit of a doped semiconductive oxide layed on the dielectric body to be electroded to which metal electrodes and/or lead connections are then affixed. An important feature of this novel electrode is that the doped metal oxide electrode is formed by a chemical reaction occurring at high temperatures. This fact not only eliminates to a great extent the undesired electrode-dielectric interface states, but also produces a very well adhering electrode, decreases the driving field necessary for causing the hysteresis phenomena, and reduce the losses when a piezoelectric transducer element is operated.

While the contact electrode has been described as a metal-doped semiconductive metal oxide electrode on dielectric bodies, it is to be noted that I found, during the course of this work, that because of the high conductivity of the doped semiconductive metal oxide layer, it is sufficient to affix lead connections to a small area of the semiconductive layer using known methods; however, even in this case the metal contact can be regarded as a metal electrode connected to the semiconductive layer. One interesting feature of this latter configuration is that the doped semiconductive metal oxide area not covered by the metal contact and lead connection, by proper choice of material, can be so prepared that it becomes transparent. As a consequence, capacitors for optical purposes, such as light valves, can also be electroded. In general, the graded MSO electrode was employed, with excellent results, not only on capacitor devices but also on semiconductor bodies such as thermistors on which excellent ohmic electrical contacts have been produced. It was found that whenever it was necessary to make an electrical contact to solid state devices of either the polycrystalline or single crystal type, by means of metallic conductors, the graded MSO electrode was found to be equal or superior to the liquid electrode. Last, but not least in importance, is the economical saving associated with this new electrode since, to a great extent, it renders unnecessary the use of silver, a metal which has been eliminated from our momentary system because of its high price and scarcity.

Although tin oxide alone is also effective in forming electrically conducting semiconductive coatings for purposes within the scope of this invention, the combinations of tin oxide with antimony oxide, or tin oxide with indium oxide, or cadmium oxide with indium oxide, are preferred for well conducting coatings possessing a surface resistivity as low as 10Ω to a few KΩ. For the purpose of modifying the properties of the conducting compositions of tin oxide and antimony oxide, or tin oxide and indium oxide, other metal oxides, such as those of zinc, copper, iron, manganese, cobalt, vanadium, etc., may also be added in small amounts (usually called dopants) not exceeding perhaps 10%. The compositions presented are examples, but not limitations, of solutions which can be used to produce conductive coatings for electrode contacts in accordance with the invention.

What I claim as new is:

1. In combination with a substrate of insulating material selected from the class consisting of metal oxide dielectrics, piezoelectric ceramics, piezolectric crystals, ferroelectric ceramics, ferroelectric crystals, ferrielectric ceramics and ferrielectric crystals, said substrate having a surface, means consisting essentially of a thin layer of semiconductor oxide doped with metal impurities overlying and adhered in direct contact with said surface for conducting electric energy into the conduction band of the substrate, a metal layer means overlying and adhered in direct contact with said semiconductive oxide layer for transferring electric energy to the conduction band of the semiconductive layer, said metal and semiconductive means being correlated by the top of the energy gap of the semiconductive oxide being positioned between the conduction band level of the substrate and the Fermi level of the metal layer and the conduction bands of the semiconductive oxide and of the substrate overlapping and producing an ohmic contact having a stepped energy gap from the metal layer means to the substrate.

2. The combination of claim 1 in which the semiconductive oxide is adhered by a chemical bond.

3. The combination of claim 1 in which impurities with which the semiconductive oxide is doped are diffused into said surface.

4. The combination of claim 1 in which the semiconductive oxide is a p-type metal doped semiconductor oxide.

5. The combination of claim 1 in which the semiconductive oxide is an n-type metal doped semiconductor oxide.

6. The combination of claim 1 in which the semiconductive oxide is tin oxide doped with a metal selected from the class consisting of indium, antimony, cadmium, zinc, copper, iron, manganese, cobalt.

References Cited

UNITED STATES PATENTS

| | | | |
|---|---|---|---|
| 2,434,143 | 1/1948 | Chilowsky | 177—386 |
| 3,290,175 | 12/1966 | Cusano et al. | 136—89 |
| 3,183,359 | 5/1965 | White | 250—199 |
| 3,360,749 | 12/1967 | Sittig | 333—33 |
| 3,263,110 | 7/1966 | Berg. | |
| 3,114,066 | 12/1963 | Allen. | |
| 3,267,317 | 8/1966 | Fischer. | |
| 3,330,983 | 7/1967 | Cusano. | |

OTHER REFERENCES

Physics of Thin Films, vol. 2, Academic Press, 1964, New Jersey. (Article by Schwartz et al.)

JOHN W. HUCKERT, *Primary Examiner.*

M. EDLOW, *Assistant Examiner.*

U.S. Cl. X.R.

317—235, 237, 238